United States Patent [19]

Nelson

[11] Patent Number: 5,733,948
[45] Date of Patent: Mar. 31, 1998

[54] TACK-FREE PHOTOPOLYMER PRINTING PLATE

[75] Inventor: Lawrence Nelson, Wilmington, Del.

[73] Assignee: MAC Dermid, Imaging Technology, Inc., Waterbury, Conn.

[21] Appl. No.: 680,159

[22] Filed: Jul. 15, 1996

Related U.S. Application Data

[60] Provisional application No. 60/003,314 Sep. 6, 1995.

[51] Int. Cl.$^6$ .............................. G03F 7/035; C08F 2/50; C08K 5/06; C08K 5/00
[52] U.S. Cl. .............. 522/79; 522/96; 522/120; 522/141; 522/168; 522/169; 430/270.1; 430/280.1; 430/281.1; 430/286.1; 427/510; 427/511; 427/517; 427/519
[58] Field of Search .................... 427/510, 511, 427/517, 519; 430/270.1, 280.1, 281.1, 286.1; 522/168, 169, 96, 79, 120, 141

[56] References Cited

U.S. PATENT DOCUMENTS

| | | | |
|---|---|---|---|
| 4,946,758 | 8/1990 | Kurtz et al. | 430/259 |
| 5,124,237 | 6/1992 | Littmann et al. | 430/309 |
| 5,262,486 | 11/1993 | Tesler et al. | 525/243 |
| 5,496,685 | 3/1996 | Farber et al. | 430/306 |
| 5,567,568 | 10/1996 | Nishioka | 430/162 |

*Primary Examiner*—Susan W. Berman
*Attorney, Agent, or Firm*—John L. Cordani

[57] ABSTRACT

A photopolymer resin composition useful in producing printing plates with low levels of surface tack is disclosed. Acetal compounds are incorporated into the photopolymer resin composition to achieve the low tack results.

5 Claims, 1 Drawing Sheet

1

TACK-FREE PHOTOPOLYMER PRINTING PLATE

This application claims priority from U.S. Provisional Application No. 60/003,314 filed Sep. 6, 1995.

FIELD OF THE INVENTION

The present invention relates to a photosensitive resin composition, and more particularly to a photosensitive resin composition which is improved with respect to the absence of substantially all surface tack in relief printing plates produced therefrom after exposure to actinic radiation, development, and post-exposure.

BACKGROUND OF THE INVENTION

In flexographic printing, also known as relief printing, ink is transferred from a pool of ink to a substrate by way of a printing plate. The surface of the plate is shaped so that the image to be printed appears in relief; in the same way that rubber stamps are cut so as to have the printed image appear in relief on the surface of the rubber. Typically, the plate is mounted on a cylinder, and the cylinder rotates at high speed such that the raised surface of the printing plate contacts a pool of ink, is slightly wetted by the ink, then exits the ink pool and contacts a substrate web, thereby transferring ink from the raised surface of the plate to the substrate to form a printed substrate.

Flexographic printing competes with other forms of printing, e.g., lithography, gravure and letterpress printing. Those involved in the flexographic printing industry are constantly striving to improve the flexographic printing process in order to more effectively compete with other printing methods. One area which has received much attention from researchers is the development of improved plates for flexographic printing.

Photopolymerizable resin compositions which are used in the production of flexographic printing plates generally comprise an elastomeric binder, herein sometimes referred to as a prepolymer, at least one monomer and a photoinitiator. To prepare the plates, there is generally formed a photopolymerizable layer interposed between a support and one or more cover sheets that may include slip and release films to protect the photosensitive surface. Prior to processing the plate, the cover sheet(s) may be removed, and the photosensitive surface exposed to actinic radiation in an image wise fashion, i.e., through a mask. Upon image wise exposure to actinic radiation, polymerization, and hence, insolubilization of the photopolymerizable layer occurs in the exposed areas. Treatment with a suitable developer removes the unexposed areas of the photopolymerizable layer leaving a printing relief which can be used for flexographic printing. After development, the photopolymer relief image is then subjected to a post-exposure process to fully cure the background, or floor, of the printing plate, as well as the sides of the relief image, which are only in a partially cured state after the image development step.

Many different elastomeric materials have been investigated for the preparation of the photopolymer plates. These include polyamide-based photopolymer (containing a polyamide as an essential component) which dissolves or swells in a washout solution (typically, water, alkaline aqueous solution, or alcohol), a polyvinyl alcohol-based photopolymer (containing polyvinyl alcohol as an essential component), a polyester-based photopolymer (containing a low-molecular weight unsaturated polyester as an essential component), an acrylic-based photopolymer (containing a low-molecular weight acrylic polymer as an essential component), a butadiene copolymer-based photopolymer (containing a butadiene or isoprene/styrene copolymer as an essential component), or a polyurethane-based photopolymer (containing polyurethane as an essential component).

Methacrylate- or acrylate-terminated polyurethane oligomers diluted with various (meth)acrylate monomers and a photoinitiator are described in U.S. Pat. Nos. 4,006,024 and 3,960,572. The entire disclosures of U.S. Pat. Nos. 4,006,024 and 3,960,572 are incorporated herein by reference.

U.S. Pat. Nos. 4,006,024 and 3,960,572 disclose photosensitive resin compositions comprising at least one prepolymer having a number average molecular weight of about 800 to 20,000, at least one polymizable ethylenically unsaturated monomer, and a photopolymerization initiator.

The surface of such photopolymer printing plates often possess a noticeable amount of surface tack, even after the post-exposure step. Various difficulties can arise as a result of the presence of excessive surface tack in a flexographic printing plate. These can include adherence of paper dust to the printing surface of the plate which results in incomplete transfer of ink to the printed sheet thereby necessitating stopping the printing press to clean the plates. In addition, when the substrate to be printed is paper, in particular a multilayer substrate such as a corrugated board, excessive tack on the plate surface can cause one or more layers of paper to peel away and adhere to the plate surface, also requiring stopping of the printing press for cleaning.

U.S. Pat. No. 4,716,094, the entire disclosure of which is incorporated herein by reference, teaches incorporation of a carboxylic acid, amide, or ester into a photosensitive resin used in making a flexographic printing plate. Printing plates prepared from the photosensitive resin are substantially free of surface tack under most circumstances. However, even these printing plates are not entirely suitable with regard to surface tack-free characteristics for all uses in flexographic printing.

WO 95/08137 discloses incorporation of acetals as antiozanats into a photosensitive sheet used in making flexographic printing plates.

SUMMARY OF THE INVENTION

The present invention provides a photopolymer resin composition useful in the preparation of relief printing plates which do not possess substantially any residual surface tack, wherein said photopolymer resin composition comprises an unsaturated polyurethane prepolymer (i), a reactive diluent monomer or mixture of monomers (ii), a photopolymerization initiator (iii), an acetal or hemiacetal (iv), and an alkyl carboxylic acid, amide, or ester (v). The resin composition may also contain an alkyldiethanol amine (vi).

DETAILED DESCRIPTION OF THE INVENTION

Figure 1:
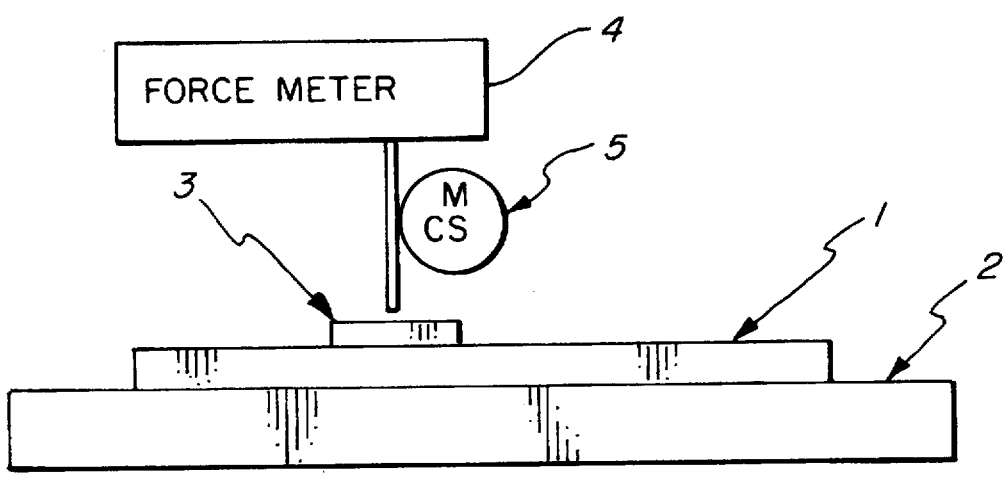
FIG. 1 is a schematic diagram of an apparatus for determining the surface tack of a printing plate.

One of the previously known causes of surface tack in relief printing plates is inhibition of photopolymerization at the surface of printing plates due to oxygen. Many additives are known which increase the effectiveness of photopolymerization. These include addition of various known amine synergists, with or without benzophenone, and in particular the use of alkyldiethanol amines as synergists either with benzophenone, or with other photoinitiators, such as 2,2-dimethoxy-2-phenylacetophenone and the like. These additives are particularly known in photocurable coating applications, and photoresist applications. When alkyldiethanol amines are added to photocurable resins known in the prior art for use in relief type printing plates, an increase in the cure rate, and an increase in the thickness of cured resin formed by a given exposure to actinic radiation was observed. However, no reduction or other difference in surface tack characteristics of the printing plates was observed.

It has been found that by incorporating an effective amount, to be defined later, of an acetal or hemiacetal along with an effective amount of an alkyl carboxylic acid, amide, or ester, also to be defined later, in a photosensitive resin, that a reduction in tack to a substantially tack-free state can be obtained. The photosensitive resin of the instant invention may be with or without an alkyl diethanolamine.

Therefore, it is an object of the present invention to provide a photosensitive resin composition which is improved in that the relief printing plates produced therefrom according to the present invention are substantially tack-free.

It is a further object of the present invention to provide a process of preparing a tack-free relief printing plate using the instant photosensitive resin compositions.

In one aspect of the present invention, there is provided a photosensitive resin composition which comprises: a photosensitive resin composition; at least one compound (I) represented by the general formula (I), $$R^1\text{---}X \qquad (I)$$

wherein $R^1$ represents a monovalent hydrocarbon residue represented by $C_nH_{2n+1}$ in which n is an integer of from 11 to 21, and X represents —COOH, —CONH$_2$, or —CO$_2$R$^2$, where $R^2$ represents a monovalent carbon residue having from 1 to 6 carbon atoms, an alkyl diethanolamine compound (II) represented by the general formula (II), $$R^3\text{---}N\text{---}(CH_2\text{---}CH_2OH)_2 \qquad (II)$$

wherein $R^3$ represents a monovalent hydrocarbon residue represented by $C_nH_{2n+1}$ in which n is an integer of from 1 to 6, and at least one acetal compound which may be represented by the general formula (III),

wherein R' represents a hydrogen atom, a monovalent hydrocarbon residue represented by $C_nH_{2n+1}$ or $C_nH_{2n}$, in which n is an integer of from 1 to 6 or greater, or an hydrocarbon ether residue; where R and R" may each independently be a hydrogen atom, a monovalent hydrocarbon residue represented by $C_nH_{2n+1}$ or $C_nH_{2n}$, in which n is an integer of from 1 to 6 or greater, or an hydrocarbon ether residue. The hydrocarbon residues may be substituted with alcohol or ether type functionalities.

Alternatively, the acetal compound may be represented by the general formula (IV),

wherein R' represents a hydrogen atom, a monovalent hydrocarbon residue represented by $C_nH_{2n+1}$ or $C_nH_{2n}$, in which n is an integer of from 1 to 6 or greater, or an hydrocarbon ether residue and $R^{IV}$ represents a hydrocarbon residue represented by $C_nH_{2n+1}$ or $C_nH_{2n}$, in which n is an integer of from 1 to 6 or greater, or an hydrocarbon ether residue. The hydrocarbon residues may be substituted with alcohol or ether type functionalities.

Alternatively, the acetal compound may be represented by the general formula (V),

wherein $R^V$ represents a hydrocarbon residue represented by $C_nH_{2n+1}$ or $C_nH_{2n}$, in which n is an integer of from 1 to 6 or greater, or an hydrocarbon ether residue and R" may be a hydrogen atom, a monovalent hydrocarbon residue represented by $C_nH_{2n+1}$ or $C_nH_{2n}$, in which n is an integer of from 1 to 6 or greater, or an hydrocarbon ether residue. The hydrocarbon residues may be substituted with alcohol or ether type functionalities.

In a second aspect of the present invention, there is provided a photosensitive resin composition which comprises: a photosensitive resin composition containing at least one compound represented by the general formula (I), and a compound or compounds represented by the general formulas (III), (IV) and (V). The photosensitive resin composition need not contain a type (II) compound.

Specific examples of compound (I) that would be useful according to the invention include: myristic acid, lauric acid, palmitic add, stearic add, myristamide, lauramide, oleamide, kenamide, dilauryl thiodipropionate and dimyristyl thiodiproprionate. The compound (I) may be added to the photocurable resin of the invention as a single compound, or as a mixture of several compounds. The amount of the compound (I) to be added to the present invention is not critical, and varies according to the kind, and solubility of the compound (I). In general, the preferred amount of compound (I) to be added is from about 0.3% by weight to about 5% by weight. More preferably it is added in between 1.0% by weight and 3.0% by weight.

Specific examples of compound (II) that are useful according to the instant invention include: methyldiethanol amine (MDEA), ethyldiethanol amine, triethanol amine, propyldiethanol amine and ethoxylated triethanol amine. The amount of compound (II) to be added is generally, from about 0.5 equivalents by weight to about 4.0 equivalents by weight, relative to the amount of photoinitiator incorporated in the photocurable resin. Generally, when lower levels of photoinitiator are used in the photocurable resin, such as 0.25 weight per cent, a higher equivalent of the alkyldiethanol amine, such as 2 to 4 equivalents, is used Also, when a higher amount of photoinitiator, such as 0.5% by weight, is used in the photocurable resin, a lower equivalent amount, such as 0.5 equivalents, of the alkyldiethanol amine is used.

Specific examples of acetal compound that would be useful according to the invention include: glycerol formal, 1,4-dioxane-2,3-diols, 1,4-dioxane substituted with alcohol groups in the 2 or 3 position, furfuryl acetals, and 1,3-dioxanes, such as 1,3-dioxane-5,5-dimethanol. Preferably the acetal compound comprises glycerol formal. The amount of compound to be added is generally from about 0.005% by weight, relative to the amount of photocurable resin to about 10°. Preferred range is from about 0.05% to 1% in the resin.

In addition to the described acetal compound and the alkylcarboxylic acid component, with or without alkyl diethanolamine, the instant photosensitive resins further comprise: an unsaturated polyurethane prepolymer (i), a reactive diluent monomer or mixture of monomers (ii), and a photopolymerization initiator (iii).

The initial component (i) of the photosensitive resin composition of the invention are any of the typical prepolymers used in photocurable resins, such as acrylated or methcrylated polyurethanes, acrylated or methacrylated polyesters, acrylated or methacrylated polyamides, acrylated or methacrylated hydrocarbon elastomers, including but not limited to polybutadiene, ethylene-butadiene copolymer, ethylene-propylene copolymer rubber, and the like, and methacrylated or acrylated epoxy-functionalized oligomers. Particularly contemplated are acrylated or methacrylated polyurethanes. Suitable methacrylated polyurethanes include those of the type disclosed in U.S. Pat. No. 3,960,572, U.S. Pat. No. 4,139,436 and in U.S. Pat. No. 5,288,571, the disclosures of which are herein incorporated by reference.

The second component (ii) of the photosensitive resin composition of the invention is known as a reactive monomer, or simply a monomer. The monomer of the instant invention may be any commonly available molecule having one or more photopolymerizable functional groups, where ethylenically unsaturated groups are a typical photopolymerizable functional group preferred in the invention. A preferred reactive monomer is a mono- or poly- acrylic or methacrylic compound, including esters thereof. The designation (meth)acrylate and (meth)acrylic will be used herein and throughout this description to simultaneously refer to one or both of methacrylic acid and acrylic acid ((meth)acrylic), or esters thereof ((meth)acrylate).

The use of a compound having two or more ethylenically unsaturated groups in the molecule increases the hardness of the printing plate. Therefore, the amount of such compounds to be used should be controlled so that a printing plate having the desired hardness is obtained. For this reason, it is preferred that the reactive monomer be a mixture of a mono(meth)acrytate ester and a poly(meth)acrylate ester.

Exemplary reactive monomers are the esters of acrylic acid and/or methacrylic acid with monohydric or polyhydric alcohols, and include, for example and without limitation, butyl (meth)acrylate, 2-ethylhexyl (meth)acrylate, isodecyl (meth)acrylate, lauryl (meth)acrylate, phenoethoxy (meth) acrylate, ethylene glycol di(meth)acrylate, 2-hydroxyethyl (meth)acrylate, hexane-1,6-diol di(meth)acrylate, 1,1,1-trimethylolpropane tri(meth)acrylate, di, tri, and tetraethylene glycol di(meth)acrylate, tripropylene glycol di(meth) acrylate, pentaerythritol tetra(meth)acrylate, propoxylated trimethylolpropane mono- di- and tri-(meth)acrylate, ethoxylated trimethylolpropane tri(meth)acrylate, and oligomeric polybutadienes with (meth)acrylic acid, i.e., oligomeric polybutadienes possessing activated, photopolymerizable olefinic double bonds.

Preferred monomers are laurylmethacrylate, polypropyleneglycol monomethacrylate, phenoethoxymethacrylate, trimethylolpropane trimethacrylate and tetraethyleneglycol dimethacrylate.

The proportion of reactive monomer in the photosensitive resin formulation of the invention is dictated at least in part by the desired viscosity of the resulting liquid photosensitive resin. The greater the amount of monomer incorporated into the photosensitive resin, the lower is the resultant viscosity of the resin, for a given molecular weight of polyurethane prepolymer. The viscosity of the photosensitive resin is preferably between 10,000 cps and 100,000 cps, and more preferably between 20,000 cps and 50,000 cps. Most preferably, it is from about 25,000 cps to about 40,000 cps. The amount of unsaturated reactive monomer required for a given molecular weight polyurethane prepolymer to achieve a given viscosity for the photosensitive resin can be readily determined by one skilled in the art without undue experimentation.

The thickness of a printing plate for printing on a corrugated board is typically from about 0.125 inches to about 0.250 inches. The thickness of the relief layer of such printing plates is typically from about 0.040 inches to about 0.150 inches, depending on the thickness of the printing plate. A photosensitive resin with a viscosity as described above minimizes the flow that might occur during the formation of a layer of said thickness that would cause undesired variations in the thickness of the photosensitive resin layer, but still makes for easy idling and transferring of the photosensitive resin during manufacturing. Flexographic printing plates for printing on substrates other than corrugated boards may require plate thicknesses other than those above.

Typically, the reactive monomer is present in from about 10 to about 35 weight percent of the photopolymerizable mixture, and more preferably in from about 15 to about 30 weight percent of the mixture.

The third component of the photosensitive resin composition of the invention is a photopolymerization initiator (iii). There is no particular limitation with respect to the type of photopolymerization initiator to be used in the present invention. Therefore, any commonly used photopolymerization initiator customarily used in photosensitive resin compositions may be used.

As the photopolymerization initiator used in the present invention, use may be made of one or more than one of acenaphthenequinone, acylphosphineoxide, α-aminoacetophenone, benzanthraquinone, benzoin methyl ether, benzoin isopropyl ether, benzoin n-butyl ether, benzoin isobutyl ether, benzophenone, benzoyldimethylketal, benzophenone, benzil dimethyl acetal, benzil 1-methyl 1-ethyl acetal, camphorquinone, chloroacetophenone, 2-chlorothioxanethone, dibenzosuberone, 2,2-diethoxy-2-phenylacetophenone, 2,2-diethoxyacetophenone, 2-dimethoxybenzoyldiphenylphosphine oxide, 2,2-dimethoxy-2-phenylacetophenone, (i.e., Irgacure®651available from Ciba-Geigy), 4,4'-bis (dimethylanino)benzophenone, 2-ethylanthraquinone, ethyl 2,4,6-trimethylbenzoylphenyl phosphinate, glyoxyester, hexanophenone, hydroxyacetophenone, 2-hydroxy-2-methylpropiophenone, 2-hydroxy-2-methyl-4'-isopropylisopropiophenone, 1-hydroxycyclohexyl phenyl ketone, 3-ketocoumarin, o-methoxybenzophenone, (methyl) -benzoylbenzoate, methylbenzoyl formate, Michler's ketone, 4'-morpholinodeoxybenzoin, 4-morpholinobenzophenone, alpha-phenylbutyrophenone, sodium 2,4,6-trimethylbenzoylphenylphosphinate, thioxanone, thioxanethone, 10-thioxanthenone, thioxanthen-9-one, tetramethylthiuram monosulfide, 3,3',4,4'-tetra(t-butylperoxicarbonyl)-benzophenone, trichloroacetophenone, 2,4,6-trimethylbenzoyldiphenylphosphine oxide, valerophenone, xanethone, p-diacetylbenzene, 4-aminobenzophenone, 4'-methoxyacetophenone, benzaldehyde, alpha-tetralone, 9-acetylphenanthrene, 2-acetylphenanthrene, 3-acetylphenanthrene, 3-acetylindone, 9-fluorenone, 1-indanone, 1,3,5-triacetylbenzene, xanthene-9-one, 7-H-benz[de]anthracen-7-one, 1-naphthaldehyde, 4,4'-bis (dimethylamino)-benzophenone, fluorene-9-one, 1'-acetonaphthone, 2'-acetonaphthone, 2,3-butanedione, acetonaphthene benz[a]anthracene 7,12 diene. Phosphines such as triphenylphosphine and tri-o-tolylphosphine are also operable herein as photoinitiators.

A photoinitiator can be used alone or as a mixture with one another or in combination with coinitiators, e.g., ethylanthraquinone with 4,4'bis(dimethylamino)benzophenone, benzoin methyl ether with triphenylphosphine, diacylphosphine oxides with tertiary amines or acyldiarylphosphine oxides with benzil dimethyl acetal.

The amount of the photopolynefization initiator can be any effective concentration which will allow the formation of a floor layer to the flexographic printing plate via a back exposure of a reasonable length of time and the formation of the relief image with the required image resolution. This time is related to the type of image being formed, as well as the thickness of the desired flexographic printing plate. The effective amount of photopolymerization initiator is dependent on the type of initiator chosen.

A concentration range of 0.1–10 wt % photoinitiator is suggested. When the amount of photoinitiator is less than 0.1%, the ultraviolet setting density is lowered and the physical properties of the photopolymer plate are extremely lowered. When the photoinitiator amount exceeds 10 wt %, no beneficial effect is observed for any property, and the cost of the fortrelation becomes commercially undesirable.

A preferred photoinitiator is 2,2-dimethoxy-2-phenylacetophenone, which may be present in the photopolymefizable mixture of the invention in an amount of from about 0.1% to about 5%, preferably about 0.1% to about 1.5%, and more preferably from about 0.15% to about 0.5%.

To protect the photopolymerizable mixtures from decomposition by thermal oxidation and oxidation by atmospheric oxygen, effective amounts of conventional antioxidants may be added to the mixture. Exemplary antioxidants are, for example, sterically hindered monophenols, such as 2,6-di-tert-butyl-p-cresol (BHT), alkylated thiobisphenols and alkylidenebisphenols, such as 2,2-methylenebis-(4-methyl-6-tertbutylphenol) or 2,2-bis(1-hydroxy-4-methyl-6-tert-butylphenyl) sulfide, hydroxybenzyls, such as 1,3,5-trimethyt-2,4,6-tris-(3,5-di-tert-butyl-4-hydroxybenzyl)benzene, triazines, such 2-(4-hydroxy-3,5-tert-butytanilino)-4,6-bis-(n-octylthio)-1,3,5-triazine, polymerized trimethyldihydroquinone, dibutylzinc dithiocarbamate, dilauryl thiodipropionate and phosphites, such as tris (nonylphenyl) phosphite. BHT is a preferred antioxidant.

It is preferred to use an aqueous developer. The developer is most desirably water (tap water) having a pH of 5.0–9.0 which may optionally contain an alkaline compound (such as sodium hydroxide and sodium carbonate), surfactant, and water-soluble organic solvent. The addition of a surfactant is desirable for the photopolymer to readily disperse into water and to remain dispersed in water. Preferred surfactants are sodium alkyl-naphthalenesulfonate and sodium alkylbenzenesulfonate. Other examples of the surfactant include anionic surfactants containing a carboxylate, sulfate-ester, sulfonate, or phosphate-ester; nonionic surfactants such as polyethylene glycol derivative, polyhydric alcohol derivative, and sorbitan derivative; cationic surfactants containing a primary, secondary or tertiary amine salt, or a quaternary ammonium salt; and amphoteric surfactants containing an amino acid hydrophilic group or a betaine hydrophilic group. The washout solution should be used at 25°–50° C., preferably 30°–40° C. The concentration of the surfactant in water is not limited, but is generally in the range of about 0.5% to about 4%. While the plate is most often developed by spray washing with the aqueous developer solution, other techniques, including those mentioned above, may be used as well.

After developing, photopolymer flexographic printing plates generally retain at least some degree of surface tackiness, particularly on the "shoulders" of the relief and other non-image areas. This is principally due to the fact that these areas are cured well enough to be resistant to being removed by the development solution, yet are not fully cured. Several methods have been developed to finish the curing of these areas of the printing plate through a post-curing step, and may be applied to the printing plates of the invention, For example, it is well known in the art that exposure to short wavelength irradiation, such as is known from U.S. Pat. No. 4,202,696, incorporated herein by reference in its entirety, can reduce surface tack by postcuring the plate with short wavelength actinic radiation after exposure to certain carbonyl compounds including benzophenone. In addition, post-curing can be accomplished by exposing the plate to actinic radiation for some period of time. This is optimally accomplished in the absence of oxygen, so as not to inhibit the post-curing. In particular, this post-curing can be accomplished under a nitrogen atmosphere, or under water, particularly where the water contains a dissolved ionic compound which scavenges oxygen which may be dissolved in the water.

The following examples are provided to better disclose and teach the preparation of the photosensitive resin compositions and printing plates of the present invention. These examples are for illustrative purposes only, and it must be acknowledged that minor variations and changes can be made without materially affecting the spirit and scope of the invention.

General Procedures

The surface tack of a printing plate is measured in terms of the value of the stress required to separate a steel foot covered with a 1 cm$^2$ sheet of polyethylene terepthalate which has been forced onto the surface of a sample plate using a force meter (Omega force meter model DFG-2 obtained from Omega Engineering Inc.). The particulars of the method for measuring the surface tack as mentioned above are described below with reference to FIG. 1.

In FIG. 1, there is shown a schematic diagram of an apparatus for detemining the surface tack of a printing plate. A printing plate 1 is attached to a level support 2 in such a manner that the relief face of the plate is directed upward An steel foot 3 of 0.25 in. radius attached to the digital force gauge and brought into contact with a polyester sheet 6 which is in contact with a plain portion of the relief face of the plate 1. A load of 500 g is applied to the steel foot as measured with the force meter 4 and allowed to stand for 10 seconds. Then, the foot is lifted upward by means of a platform motor 5 at a constant elevation speed of 2 in./min until the plate is separated from the foot. The value of the stress just before the separation of the foot 3 from the plate 1 is measured using the force meter. The value of the surface tack is obtained by dividing the value as measured above by the area in cm$^2$ of the polyester sheet, which in this case is 1 cm$^2$.

Each of the photopolymerizable compositions of the following examples was formed into a photopolymer printing plate according to the following procedure. Using an exposure unit (MERIGRAPH® type 50 exposure unit, Hercules Incorporated, Wilmington, Del.), a 0.155" nominally thick layer of the photosensitive resin composition was formed as a layer between an adhesive coated polyester backing sheet and a cover sheet of polypropylene film, which separated the photo resin from a photographic negative. The photopolymer was subjected to a back-side exposure of 1:00, followed by an imaging exposure of 2:25. After the exposure, the cover sheet was removed and the uncured resin was removed by spray washing with an aqueous solution containing 1% by weight Merigraph® washout detergent 1695 (trade name of ionic detergent sold by Hercules Incorporated), 1% by weight of a defoamer (W6200 defoamer sold by Hercules Incorporated), and 1% by weight sodium hexamethapolyphosphate at 30°–35° C. for ten mutes to obtain a relief plate. Then the plate was immersed in an aqueous solution of sodium sulfite and subjected to postexposure by actinic radiation having a minimum intensity of 8 Mw/cm² to completely cure the relief portion of the plate. The plate was then dried for 60 minutes at 40° C. Further, the plate may be subjected to a dry post-exposure step under germicidal lights for 10 minutes. The surface tack of each plate was measured as described above.

COMPARATIVE EXAMPLE 1

A 0.155 inch thick plate was made from a commercial 25 Shore A resin, LPO25 from Hercules Incorporated. The resin is based on a polyether polyurethane and contains 2% by weight myristic acid and 0.2% by weight KEMAMIDE E (Witco Corporation) as slip agents. The measured surface tack of the photopolymer plate after cleaning the surface of the plate with EMERALD FLEXO CLEANER (Matthew's International) is shown in Table A.

EXAMPLES 1–3

Glycerol formal and MDEA were added to the commercial LPO25 resin in varying amounts and the effect on plate surface tack after standard plate processing and after cleaning with Emerald Flexo Cleaner, as described in Comparative Example 1, were determined. Plate tack results are shown in Table A. Values in the table for glycerol formal and MDEA are expressed in weight percents as added to the LPO25 resin.

TABLE A

| Example | Glycerol Formal (wt %) | MDEA (wt %) | Surface Tack (g/cm²) |
|---|---|---|---|
| Comparative Example 1 | 0 | 0 | 246 |
| 1 | 0 | 0.3 | 172 |
| 2 | 0.1 | 0.3 | 43 |
| 3 | 0.1 | 0 | 45 |

EXAMPLES 4–5

The effect of a post light finishing step on plate tack was aim investigated. After washing the plates out and after post exposure but before drying of the plates, the plates of comparative example 1 and examples 1 and 2 were light finished under a combination of germicidal and black lights for 10 minutes. The plates were light finished in the same post exposure bath composition used in the standard post expose process. Plate surface tack values are shown in Table B.

TABLE B

| Example | Glycerol Formal (wt %) | MDEA (wt %) | Surface Tack (g/cm²) |
|---|---|---|---|
| Comparative Example 2 | 0 | 0 | 102 |
| 4 | 0 | 0.3 | 17 |
| 5 | 0.1 | 0.3 | 12 |

What is claimed is:

1. A process for producing a printing plate comprising:
   a. selectively exposing a liquid photopolymer resin to a source of actinic radiation; and
   b. developing away the unexposed portions of the liquid photopolymer resin;
   wherein the liquid photopolymer resin comprises:
   1. at least one acrylate or methacrylate functional prepolymer;
   2. at least one acrylate or methacrylate functional monomer;
   3. at least one photoinitiator;
   4. at least one acetal compound;
   5. at least one alkyl compound selected from the group consisting of $R^1$-X and $R^3$-N-$(CH_2$-$CH_2OH)_2$; where $R^1$ represents a monovalent hydrocarbon residue represented by $C_mH_{2m+1}$ in which m is an integer of from 11 to 21, and X represents —COOH, —$CONH_2$, or $CO_2R^2$, where $R^2$ represents a monovalent carbon residue having from 1 to 6 carbon atoms; and where $R^3$ represents a monovalent hydrocarbon residue represented by $C_nH_{2n+1}$ in which n is an integer of from 1 to 6;

and wherein the acetal compound is an acetal compound of the structure

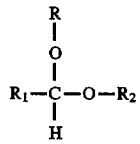

wherein R, $R_1$ and $R_2$ are independently selected from the group consisting of hydrogen, hydrocarbon ether residues, hydrocarbon residues which hydrocarbon residues are represented by $C_nH_{2n+1}$ or $C_nH_{2n}$ and n is an integer from 1 to 6, and substituted hydrocarbon residues where one or more hydrogens of the substituted hydrocarbon residues have been substituted with alcohol or ether functionality.

2. A process for producing a priming plate comprising:
   a. selectively exposing a liquid photopolymer resin to a source of actinic radiation; and
   b. developing away the unexposed portions of the liquid photopolymer resin;
   wherein the liquid photopolymer resin comprises:
   1. at least one acrylate or methacrylate prepolymer functional;
   2. at least one acrylate or methacrylate functional monomer;
   3. at least one photoinitiator;
   4. at least one acetal compound;
   5. at least one alkyl compound selected from the group consisting of $R^1$—X and $R^3$—N—$(CH_2$—$CH_2$—$OH)_2$ where $R_1$ represents a monovalent hydrocarbon residue represented by $C_mH_{2m+1}$ in which m is an integer of from 11 to 21, and X represents —COOH, —$CONH_2$ or —$CO_2R^2$, where $R^2$ represents a monovalent carbon residue having from 1 to 6 carbon atoms; and where $R^3$ represents a monovalent hydrocarbon residue represented by $C_nH_{2n+1}$ in which n is an integer of from 1 to 6;

and wherein the acetal compound is an acetal compound of the structure;

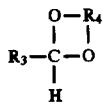

wherein $R_3$ and $R_4$ are independently selected from the group consisting of hydrogen, hydrocarbon ether residues, hydrocarbon residues which hydrocarbon residues are represented by $C_nH_{2n+1}$ or $C_nH_{2n}$ and n is an integer from 1 to 6, and substituted hydrocarbon residues where one or more hydrogens of the substituted hydrocarbon residues have been substituted with alcohol or ether functionality.

3. A process for producing a priming plate comprising:
  a. selectively exposing a liquid photopolymer resin to a source of actinic radiation; and
  b. developing away the unexposed portions of the liquid photopolymer resin;

wherein the liquid photopolymer resin comprises:
  1. at least one acrylate or methacrylate functional prepolymer;
  2. at least one acrylate or methacrylate functional monomer;
  3. at least one photoinitiator;
  4. at least one acetal compound;
  5. at least one alkyl compound selected from the group consisting of $R^1$—X and $R^3$—N—$(CH_2$—$CH_2$—$OH)_2$; where $R^1$ represents a monovalent hydrocarbon residue represented by $C_mH_{2m+1}$ in which m is an integer of from 11 to 21, and X represents —COOH, —$CONH_2$ or —$CO_2R^2$, where $R^2$ represents a monovalent carbon residue having from 1 to 6 carbon atoms; and $R^3$ represents a monovalent hydrocarbon residue represented by $C_nH_{2n+1}$ in which n is an integer of from 1 to 6;

and wherein the acetal compound is an acetal compound of the structure;

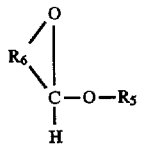

wherein $R_5$ and $R_6$ are independently selected from the group consisting of hydrogen, hydrocarbon ether residues, hydrocarbon residues which hydrocarbon residues are represented by $C_nH_{2n+1}$ or $C_nH_{2n}$ and n is an integer from 1 to 6, and substituted hydrocarbon residues where one or more hydrogens of the substituted hydrocarbon residues have been substituted with alcohol or ether functionality.

4. The process of any one of claims 1, 2 or 3 wherein the photopolymerizable composition also comprises an alkyldiethanol amine.

5. The process of any one of claims 1, 2 or 3 wherein the alkyl compound is selected from the group consisting of myristic acid, lauric acid, palmitric acid, stearic acid, myristamide, lauramide, oleamide, kenamide, dilauryl thiodipropionate and dimyrstyl thiodipropionate.

* * * * *